Aug. 11, 1970 TAKASHI TOKUYAMA ET AL 3,523,819

METHOD FOR TREATING THE SURFACE OF SEMICONDUCTOR DEVICE

Filed Jan. 16, 1968

United States Patent Office 3,523,819
Patented Aug. 11, 1970

3,523,819

METHOD FOR TREATING THE SURFACE OF SEMICONDUCTOR DEVICE

Takashi Tokuyama and Keijiro Uehara, Tokyo-to, Japan, assignors to Kabushiki Kaisha Hitachi Seisakusho, Tokyo-to, Japan, a joint-stock company of Japan Continuation-in-part of application Ser. No. 341,008, Jan. 29, 1964. This application Jan. 16, 1968, Ser. No. 703,209
Claims priority, application Japan, Feb. 4, 1963, 38/4,489
Int. Cl. H01b 3/08, 3/10
U.S. Cl. 117—213 3 Claims

ABSTRACT OF THE DISCLOSURE

A process for treating the surface of a silicon semiconductor in order to stabilize the electric characteristics thereof and to avoid decrease of the breakdown voltage of a p-n junction formed therein which comprises the steps of immersing the semiconductor into pure hydrofluoric acid HF to remove oxides of the semiconductor existing thereon and then into alcohol and thereafter providing a protective silicon dioxide film on the surface of the semiconductor which formed by pyrolysis of an organooxysilane, constituting such a surface.

Figure 1:
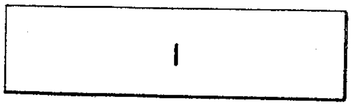

This application is a continuation-in-part of prior application Ser. No. 341,008 filed on Jan. 29, 1964, and now abandoned, in the name of Takashi Tokuyama and Keijiro Uehara, and entitled "Method of Manufacturing Semiconductor Devices."

This invention relates to a method for treating the surface of semiconductor devices, and more particularly to a method for treating the surface of a silicon semiconductor device to provide a stabilized surface condition.

It is well known in the art to provide a silicon dioxide film on the surface of a semiconductor device, especially of a silicon semiconductor device, in order to improve its electrical characteristics as well as its reliability. There are various methods for forming a silicon dioxide film on the surface of the silicon semiconductor device. One of the most conventional methods is attained by heating a silicon body at a high temperature in an oxidizing atmosphere to oxidize the surface thereof. This method is, in general, called "a high temperature oxidizing method." Another conventional method is attained by depositing silicon dioxide on the surface of a silicon body by the pyrolytic decomposition of organooxysilane such as tetraethoxysilane carried out under a relatively low temperature. Among various methods of treating silicon semiconductor devices having stabilized surface, the most suitable method is "a planar method" which comprises the steps of preparing a silicon substrate having desired resistivity and one conductivity type; etching the surface of the substrate in the mixture solution of HF and either $HNO_3$ or $H_2SO_4$; forming a silicon dioxide layer of predetermined thickness on the surface of the substrate by the high temperature oxidation method; making a hole in the silicon dioxide layer at a predetermined portion thereof in order to expose desired part of the surface of the silicon substrate, in which a well-known photo-etching technique may be employed; and diffusing opposite conductivity type impurities through the hole into the surface of the silicon substrate in order to form at least one pn junction therein. Such pn junction formed in the silicon semiconductor substrate by this method is extended to the surface of the substrate and the exposed pn junction end is covered with the silicon dioxide layer provided on the surface. By provision of the silicon dioxide layer which is formed by oxidation of the substrate, the electrical characteristics of the device are considered to be stabilized against the surrounding atmosphere.

The inventors, however, discovered the fact that decrease in the breakdown voltage of a pn junction and change in the electrical characteristics of the device appeared as time goes on and that the reason for this was due to existence of oxides such as silicon dioxide formed by oxidation of the silicon surface. Although it is not quite certain why the breakdown voltage decreases and the characteristics change in accordance with existence of the silicon dioxide formed by oxidation of the substrate surface, it is assumed that these phenomena are caused due to the following mechanism: since the silicon dioxide formed during its formation by oxidation of the surface of a silicon substrate contains therein movable ions such as sodium ions, induction of electrons into the surface portion of the semiconductor substrate adjacent to the silicon dioxide occurs due to the existing movable ions as well as the conductivity conditions of the interface between the silicon substrate and the silicon oxide layer. The surface portion of the silicon substrate wherein a number of electrons are induced is called "channel" in the field of semiconductor manufacture. The conductivity conditions of the channel are turned into n-conductivity type in case the semiconductor substrate is of p-type, or are rendered into stronger n-conductivity type in case the substrate is n-conductivity type. Owing to the presence of the channel, the breakdown voltage of the pn junction of the device formed therein is considered to drop down.

Further, the concentration of electrons thus induced varies in accordance with movement of the ions existing in the silicon dioxide film, whereby the electrical characteristics of the semiconductor device are varied during operation of the device.

Consequently, the silicon semiconductor device having good electrical characteristics cannot be formed by the conventional methods, such as by the pyrolysis of organooxysilane on the silicon substrate or by oxidation of the silicon surface which permit a silicon dioxide film to be formed on the substrate.

It is the primary object of the present invention to provide a method for stabilising the electrical characteristic of a silicon semiconductor device.

It is another object of the present invention to provide a new method of surface treatment of a silicon semiconductor device.

It is still another object of the present invention to provide a treating method by which a silicon semiconductor device having stabilized electrical characteristic is obtainable.

In the method of the present invention, the surface of the silicon semiconductor device, in which one or more p-n junctions are formed by suitable method such as impurity diffusion technique, etc. is treated with a mixture of nitric acid and hydrofluoric acid, then it is washed with hydrofluoric acid and subsequently with deionized water or alcohol, and immediately thereafter the silicon dioxide is deposited on the surface of the semiconductor device by the pyrolytic decomposition of organooxysilane. The purpose of the surface treatment with hydrofluoric acid is to remove the oxide layer formed by oxidation of silicon surface after etching procedure from the surface, and the purpose of washing with deionized water or alcohol is to clean the surface treated with hydrofluoric acid. In the case of washing treatment, attention should be paid so that the temperature of the solution is room temperature and washing time is as short as possible in order to avoid generation of oxide layer on the surface.

The foregoing objects and other objects, features and advantages of the invention will become apparent from the following description of preferred embodiment of the present invention taken in conjunction with the accompanying drawing wherein:

FIGS. 1 to 4 inclusive indicate successive steps of stabilizing treatment on a silicon semiconductor device.

Figure 2:
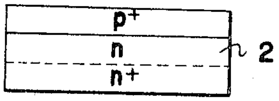
Figure 3:
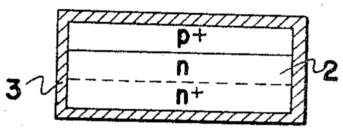
Figure 4:
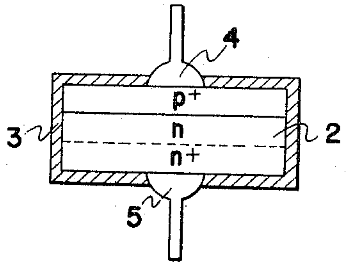

Referring now to the accompanying drawing, a semiconductor wafer having a junction of $p^+nn^+$ type is prepared by diffusing $B_2O_3$ from one surface and $P_2O_5$ from the other surface of a n-type silicon wafer 1, the resistivity of which is 100 Ω—cm. as shown in FIG. 1. The wafer is then cut into a pellet of the size of 1.5 mm. x 1.5 mm. by using a supersonic cutting machine. The surface of the pellet is then etched with a mixture of nitric acid and hydrofluoric acid (FIG. 2, 2). After it is subjected to a surface treatment as will be described later, the pellet is heated in an atmosphere of nitrogen at 700° C. and mixture of vaporized tetraethoxysilane and nitrogen is introduced onto the pellet to form a film of silicon oxide on the surface of the pellet (FIG. 3, 3). The thickness of the film is of the order of about 1 to 3 microns. Then the portion of the film is removed and electrodes 4 and 5 formed thereon, as shown in FIG. 4, to construct a rectifier element.

The following table shows the effect of various treating agents upon the inverse breakdown voltage of the element.

| Treating agent: | Inverse breakdown voltage |
|---|---|
| Hydrofluoric acid (washed with deionized water at room temperature) | 419 |
| Hydrofluoric acid (washed with alcohol at room temperature) | 360 |
| Conc. nitric acid | 266 |
| Heated hydrogen peroxide | 308 |
| High pressure steam (100 atm.) | 95 |

In this table, the surfaces treated with the first two agents have a tendency to remove the surface oxide, whereas the surface treated with the remaining three agents have a tendency to form a film of oxide on the surface. As can be noted from the above last three examples, presence of the oxide film on the surface prior to the deposition of the protective film of silicon dioxide by the pyrolysis of tetraethoxysilane gives an undesirable influence on the breakdown voltage of the element. This is due to the fact that surface condition of the element is predominated to be donor type by the covering oxide film which has been subjected to the above-described last three treatments, whereby the surface conductivity type of the n-region of the $p^+nn^+$ junction is caused to become more of the n-type, thus lowering the surface breakdown voltage. The n-region based on this phenomenon is called "channel" in the field of semiconductor manufacture. It has been confirmed by experiments that silicon dioxide film formed by the pyrolysis of tetraethoxysilane has little effect as described above. Accordingly, when the silicon dioxide film is provided during absence of another oxide film on the surface of a semiconductor having at least one pn junction therein, the breakdown voltage of the pn junction is not decreased.

There has been a similar teaching in the U.S. Pat. No. 3,242,007 to A. J. Jensen.

This patent teaches a surface treatment of a semi-conductor device prior to deposition of silicon dioxide on the semiconductor device by pyrolytic decomposition of organooxysilane which comprises a first acid treatment with an acid selected from the group of HF soak, hot $HNO_3$ and hot $H_2SO_4$, and a second acid treatment with an acid selected from the group of HF soak, hot $HNO_3$ and hot $H_2SO_4$. Jensen etaches that good combination is of first acid treatment of hot $HNO_3$ and second acid treatment of hot $H_2SO_4$. The purpose of the former treatment is to remove impurities such as metallic ions etc. from the surface of the semiconductor device and that of the latter is to oxidize the surface of the semiconductor device.

According to the Jensen patent, a protective silicon dioxide layer is formed by pyrolysis of an organooxysilane on the pre-existing silicon dioxide layer formed in accordance with the second acid treatment.

The present invention is to completely remove the pre-existing silicon dioxide layer from the surface of the silicon device by successive treatments of the device with solution of hydrofluoric acid after the etch-treatment is completed. This invention is so characterized in that the silicon dioxide formed by oxidation of the surface does not exist on the surface of the semiconductor device no more when the protective silicon dioxide is deposited by pyrolysis of the organoxysilane. This point gives to the present invention a great difference from the Jensen patent. Although Jensen teaches no treatment as the first acid treatment and HF treatment as the second acid treatment which tends to remove the oxide layer on the surface in combination of first and second acid treatments as shown in foregoing table. It, further, includes surely the step of washing the surface of the substrate in the boiled deionized water for about ten minutes and subsequently washing it in deionized water at room temperature for about 20 mintues after such HF treatment step. During this washing step, an undesirable oxide layer is formed on the surface by oxidation, so that the Jensen method can not avoid the abovementioned disadvantages due to the oxide layer.

According to the present invention, the silicon device, the surface of which is covered with the silicon dioxide layer deposited by the pyrolytic decomposition of the organooxysilane, becomes to have stabilized electrical characteristics for long time.

While the above embodiment has been described with regard to a $p^+nn^+$ type silicon rectifier, it is to be understood that this invention can be equally applied to the manufacture of silicon transistors or integrated circuit. That is, after planar transistor element or integrated circuit element is formed by the conventional method such as impurity diffusion technique, etc., the silicon dioxide layer employed as a mask of impurity diffusion is completely removed from the surface thereof, and the surface of the element is prepared with the surface treatment of the present invention and then the protective silicon dioxide layer is covered upon the surface thereof by the pyrolytic decomposition of the organooxysilane.

What we claim is:

1. A method for treating the surface of a semiconductor device having at least one p-n junction therein which extends to the surface thereof comprising steps of: immersing the device in a mixed solution of hydrofluoric acid and nitric acid for etching the surface thereof; further immersing the device in a solution of hydrofluoric acid for removing any undesired oxide layer from the surface thereof; washing the device in the solution at least formed either deionized water or alcohols for a short period of time not to allow substantial oxidation of the surface thereof; an immediately depositing a protective silicon dioxide layer on the surface of the substrate by pyrolytic decomposition of an organooxysilane.

2. The method according to claim 1, wherein washing of the device is carried out at a room temperature.

3. The method according to claim 1, wherein the organooxysilane is tetraethoxysilane.

References Cited

UNITED STATES PATENTS 3,242,007 3/1966 Jensen ---------- 117—201

WILLIAM L. JARVIS, Primary Examiner

U.S. Cl. X.L.

117—201; 156—17